United States Patent
Chen

(10) Patent No.: US 6,743,503 B1
(45) Date of Patent: Jun. 1, 2004

(54) ULTRA-THIN SEED LAYER FOR MULTILAYER SUPERLATTICE MAGNETIC RECORDING MEDIA

(75) Inventor: Ga-Lane Chen, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 8 days.

(21) Appl. No.: 09/649,587

(22) Filed: Aug. 29, 2000

Related U.S. Application Data

(60) Provisional application No. 60/157,891, filed on Oct. 5, 1999.

(51) Int. Cl.[7] .............................. G11B 5/66; G11B 5/70; C23C 14/32
(52) U.S. Cl. ................. 428/336; 428/694 TD; 428/694 TM; 428/694 TP; 428/900; 204/192.1; 204/192.2
(58) Field of Search .................... 428/694 TM, 694 TS, 428/694 TP, 213, 336, 900; 204/192.1, 192.2

(56) References Cited

U.S. PATENT DOCUMENTS

| | | | |
|---|---|---|---|
| 5,106,703 A | 4/1992 | Carcia | 428/635 |
| 5,604,030 A | 2/1997 | Yamane et al. | 428/332 |
| 5,660,930 A | 8/1997 | Bertero et al. | 428/332 |
| 5,750,270 A | 5/1998 | Tang et al. | 428/611 |
| 5,750,277 A | 5/1998 | Vu et al. | 429/7 |
| 5,846,648 A * | 12/1998 | Chen et al. | 428/332 |
| 5,851,628 A | 12/1998 | Ohkubo et al. | 428/141 |
| 5,858,566 A * | 1/1999 | Zhang | 428/694 TS |
| 5,942,342 A | 8/1999 | Hikosaka et al. | 428/694 R |
| 6,007,924 A | 12/1999 | Lal et al. | 428/611 |
| 6,077,586 A | 6/2000 | Bian et al. | 428/653 |
| 6,077,603 A | 6/2000 | Zhang | 428/332 |
| 6,083,599 A | 7/2000 | Hirayama et al. | 428/65.3 |
| 6,086,974 A | 7/2000 | Thiele et al. | 428/65.3 |
| 6,146,754 A * | 11/2000 | Song et al. | 428/332 |
| 6,183,892 B1 * | 2/2001 | Saiki et al. | 428/694 ST |
| 6,468,670 B1 * | 10/2002 | Ikeda et al. | 428/611 |

\* cited by examiner

Primary Examiner—Holly Rickman
(74) Attorney, Agent, or Firm—McDermott, Will & Emery

(57) ABSTRACT

Improved multilayer magnetic superlattice structures, such as $(Co/Pt)_n$ and $(Co/Pd)_n$, having predetermined, very high perpendicular magnetic coercivities are formed by sputter deposition of predetermined thickness, ultra-thin seed layers on the substrate prior to formation thereon of the superlattice structure by sputtering at at least a predetermined minimum sputtering gas pressure. The multilayer magnetic superlattice structures are advantageously utilized in the formation of thermally stable, perpendicular magnetic recording (MR) media having very high areal recording densities.

20 Claims, 2 Drawing Sheets

ULTRA-THIN SEED LAYER FOR MULTILAYER SUPERLATTICE MAGNETIC RECORDING MEDIA

CROSS-REFERENCE TO PROVISIONAL APPLICATION

This application claims priority from U.S. provisional application Serial No. 60/157,891 filed Oct. 5, 1999, the entire disclosure of which is incorporated herein by reference.

FIELD OF THE INVENTION

The present invention relates to an improved perpendicular magnetic recording medium comprising a sputtered multilayer magnetic superlattice exhibiting very high values of perpendicular magnetic coercivity and areal storage density, and a method for manufacturing same. The invention finds particular utility in the fabrication of very high areal recording density magnetic recording ("MR") media and devices such as hard disks.

BACKGROUND OF THE INVENTION

Magnetic recording media and devices incorporating same are widely employed in various applications, particularly in the computer industry for data/information storage and retrieval purposes, typically in disk form. Conventional magnetic thin-film media, wherein a fine-grained polycrystalline magnetic alloy layer serves as the active recording medium layer, are generally classified as "longitudinal" or "perpendicular", depending upon the orientation of the magnetic domains of the grains of magnetic material.

Efforts are continually being made with the aim of increasing the areal recording density, i.e., the bit density, or bits/unit area, of the magnetic media. However, severe difficulties are encountered when the bit density of longitudinal media is increased above about 20–50 Gb/in$^2$ in order to form ultra-high recording density media, such as thermal instability, when the necessary reduction in grain size exceeds the superparamagnetic limit. Such thermal instability can, inter alia, cause undesirable decay of the output signal of hard disk drives, and in extreme instances, result in total data loss and collapse of the magnetic bits. In this regard, the perpendicular recording media have been found superior to the more common longitudinal media in achieving very high bit densities.

As indicated above, much effort has been directed toward enhancing the density of data storage by both types of magnetic media, as well as toward increasing the stability of the stored data and the ease with which the stored data can be read. For example, it is desirable to develop magnetic media having large magnetic coercivities, $H_c$, since the magnetic moments of such materials require large magnetic fields for reorientation, i.e., switching between digital 1 and 0. Thus, when the magnetic medium has a large coercivity $H_c$, exposure of the magnetic medium to stray magnetic fields, such as are generated during writing operations, is less likely to corrupt data stored at adjacent locations.

The density with which data can be stored within a magnetic thin-film medium for perpendicular recording is related to the perpendicular anisotropy ("Ku" or "$K_\perp$") of the material, which reflects the tendency for the magnetic moments to align in the out-of-plane direction. Thin-film magnetic media having high perpendicular anisotropies have their magnetic moments aligned preferentially perpendicular to the plane of the thin film. This reduces the transition length, thereby allowing a larger number of magnetic bits (domains) to be packed into a unit area of the film and increasing the areal density with which data can be stored.

A large perpendicular anisotropy is also reflected in a larger value of the magnetic coercivity $H_c$, since the preferential out-of-plane alignment of the magnetic moments raises the energy barrier for the nucleation of a reverse magnetization domain, and similarly, makes it harder to reverse the orientation of the magnetic domains by 180° rotation. Further, the magnetic remanence of a medium, which measures the tendency of the magnetic moments of the medium to remain aligned once the magnetic field is shut off following saturation, also increases with increasing $K_\perp$.

A promising new class of materials for use as the active recording layer of perpendicular MR media includes multilayer magnetic "superlattice" structures comprised of a stacked plurality of very thin magnetic/non-magnetic layer pairs, for example cobalt/platinum $(Co/Pt)_n$ and cobalt/palladium $(Co/Pd)_n$ multilayer stacks. As schematically illustrated in the cross-sectional view of FIG. 1, such multilayer stacks or superlattice structures 10 comprise n pairs of alternating discrete layers of Co (designated by the letter A in the drawing) and Pt or Pd (designated by the letter B in the drawing), where n is an integer between about 5 and about 50. Superlattice 10 is typically formed by a suitable thin film deposition technique, e.g., sputtering, and can exhibit perpendicular magnetic isotropy arising from metastable chemical modulation in the direction normal to the underlying substrate S on which superlattice 10 is formed. Compared to conventional cobalt-chromium (Co–Cr) magnetic alloys utilized in magnetic data storage/retrieval disk applications, such $(Co/Pt)_n$ and $(Co/Pd)_n$ multilayer magnetic superlattice structures offer a number of performance advantages. For example, a sputtered $(Co/Pt)_n$ multilayer stack or superlattice 10 suitable for use as a magnetic recording layer of a perpendicular MR medium can comprise n Co/Pt or Co/Pd layer pairs, where n=about 5 to about 50, e.g., 20, and wherein each Co/Pt layer pair consists of an about 3 Å thick Co layer adjacent to an about 10 Å thick Pt or Pd layer, for a total of 40 separate (or discrete) layers. Such multilayer magnetic superlattice structures are characterized by having a large perpendicular anisotropy, high coercivity $H_c$, and a high squareness ratio of a magnetic hysteresis (M-H) loop measured in the perpendicular direction. By way of illustration, $(Co/Pt)_n$ and $(Co/Pd)_n$ multilayer magnetic superlattices, wherein n=about 10 to about 30 Co/Pt or Co/Pd layer pairs having thicknesses as indicated supra and fabricated, e.g., by means of techniques disclosed in U.S. Pat. No. 5,750,270, the entire disclosure of which is incorporated herein by reference, exhibit perpendicular anisotropies exceeding about 2×10$^6$ erg/cm$^3$; coercivities as high as about 5,000 Oe; squareness ratios (S) of a M-H loop, measured in the perpendicular direction, of from about 0.85 to about 1.0, and carrier-to-noise ratios ("CNR") of from about 30 dB to about 60 dB.

A key advance in magnetic recording (MR) technology which has brought about very significant increases in the data storage densities of magnetic disks has been the development of extremely sensitive magnetic read/write devices which utilize separate magnetoresistive read heads and inductive write heads. The magnetoresistive effect, wherein a change in electrical resistance is exhibited in the presence of a magnetic field, has long been known; however, utilization of the effect in practical MR devices was limited by the very small magnetoresistive response of the available materials. The development in recent years of materials and techniques (e.g., sputtering) for producing materials which exhibit much larger magnetoresistive responses, such as Fe—Cr multilayer thin films, has resulted in the formation of practical read heads based upon what is termed the giant magnetoresistive effect, or "GMR". Further developments in GMR-based technology have resulted in the formation of GMR-based head structures, known as GMR "spin valve" heads, which advantageously do not require a strong external magnet or magnetic field to produce large resistance changes, and can detect weak signals from tiny magnetic bits.

The use of such GMR-based spin valve heads can significantly increase the areal density of MR media and systems by increasing the track density, as expressed by the number of tracks per inch ("TPI") and the linear density, as expressed by the number of bits per inch ("BPI"), where areal density=TPI×BPI. Currently, GMR-based spin valve heads are utilized for obtaining areal recording densities of more than about 10 Gb/in$^2$; however, even greater recording densities are desired. A difficulty encountered with further increase in the BPI of conventional MR media is that the smaller grain sizes necessary for increase in the BPI results in thermal instability of the media due to exceeding the superparamagnetic limit.

As indicated supra, sputtered multilayer magnetic superlattice structures can provide several advantages vis-à-vis conventional thin-film MR media, when utilized in fabricating very high areal density MR media. Specifically, multilayer magnetic superlattice MR media exhibit higher interfacial (i.e., perpendicular) anisotropy (Ku or $K_\perp$) than conventional thin film MR media, e.g., greater values of KuV/kT (where Ku=anisotropy constant; V=volume in cm$^3$; k=Boltzmann's constant; and T=absolute temperature, °K.); increased thermal stability; and very high values of perpendicular coercivity $H_c$, i.e., >10$^3$ Oe. In this regard, the very high values of $H_c$ attainable with multilayer magnetic superlattice structures translates into a significant increase in BPI, and thus a substantial increase in areal recording density.

Multilayer magnetic superlattice structures utilized in MR media can have either an ordered structure forming a true superlattice, or a disordered structure, variously termed a "non-superlattice multilayer" or a "pseudo-superlattice structure". In (Co/Pt)$_n$ and (Co/Pd)$_n$ multilayer superlattice structures having utility in high areal density MR media, the interfaces between the Co and Pt (or Pd) layers incur surface interactions, such as for example, spin-orbit coupling. Because Co and Pt (or Pd) have different electronic shell structures or configurations, spin-orbit coupling occurs between the spin and orbital motions of the electrons. When an external magnetic field is applied for reorienting the spin of an orbiting electron, the orbit is also reoriented. However, because the orbit is strongly coupled to the metal lattice, the spin axis of the electron resists rotation. The energy required for reorienting (i.e., rotating) the spin system of a magnetic domain away from the easy direction is termed the anisotropy energy. The stronger the spin-orbit coupling or interaction, the higher the anisotropy energy and the coercivity $H_c$.

It is believed that an increase in the interfacial anisotropy of (Co/Pt)$_n$ and (Co/Pd)$_n$ multilayer magnetic superlattice structures, as by an increase in the disorder or "broken symmetry" at each of the Co/Pt or Co/Pd interfaces, can result in the obtainment of very high perpendicular magnetic coercivities $H_c$ necessary for fabricating ultra-high areal density, thermally stable MR media, i.e., perpendicular coercivities on the order of about 10$^4$ Oe. It is further believed that the amount or degree of disorder or "broken symmetry" at each of the Co/Pt or Co/Pd interfaces of sputtered (Co/Pt)$_n$ and (Co/Pd)$_n$ superlattices can be increased by substituting the conventionally employed Ar sputtering gas with a higher atomic weight sputtering gas, e.g., Kr or Xe, thereby providing bombardment of the deposited films with ionized particles having greater momentum, resulting in a greater amount of lattice disruption, disorder, and/or "broken symmetry" at the layer interfaces, as disclosed in U.S. Pat. No. 5,106,703 to Carcia, the entire disclosure of which is incorporated herein by reference.

Referring again to FIG. 1, according to conventional practices for forming multilayer magnetic superlattice structures 10 in the fabrication of magnetic recording (MR) media, at least one thin underlayer, termed a "seed layer", typically comprising at least one material selected from Pt, Pd, Ag, Au, Rh, Ir, Cu, and Mn, is interposed between the substrate S and the multilayer magnetic superlattice structure 10 for enhancing the crystallographic texturing and controlling the grain size/structure of the latter.

A frequently encountered problem in the preparation of multilayer magnetic superlattice structures for use in large scale, automated fabrication of very high recording density magnetic media is difficulty in reliably and controllably achieving a desired interfacial anisotropy of the magnetic superlattice, hence a desired perpendicular magnetic coercivity $H_c$.

Accordingly, there exists a need for improved methodology for forming, by sputtering, (Co/Pt)$_n$ and (Co/Pd)$_n$ multilayer magnetic superlattice structures exhibiting very high and readily controllable perpendicular magnetic coercivities $H_c$, i.e., as high as about 5,000 Oe, by means and methodology which can be easily and readily implemented in a cost-effective manner for fabrication of very high areal recording density MR media. Further, there exists a need for improved perpendicular MR media having very high areal recording densities and improved thermal stability, which media can be fabricated in an economical fashion utilizing conventional automated manufacturing equipment.

The present invention is based upon the discovery that regulation and control of the perpendicular magnetic coercivity of multilayer magnetic superlattice structures such as described supra can be accomplished by use of ultra-thin seed or underlayers and by proper selection of the thickness of the ultra-thin seed or underlayer, such that the seed layer thickness determines the extent of a domain wall pinning effect exerted on the magnetic superlattice, whereby the perpendicular anisotropy, hence perpendicular magnetic coercivity $H_c$, is substantially enhanced and well-controlled. According to the present invention, (Co/Pt)$_n$ and (Co/Pd)$_n$ multilayer magnetic superlattice structures having very large values of perpendicular coercivities $H_c$ as high as about 5,000 Oe, are formed over improved, ultra-thin seed or underlayers having a thickness up to about 30 Å by sputtering of Co and Pt or Pd targets at sputtering gas pressures of at least about 30 mTorr. The inventive methodology thus effectively addresses and solves problems attendant upon reliably and controllably obtaining high quality multilayer magnetic superlattice structures suitable for use in manufacturing improved perpendicular MR media having very high areal recording densities with good thermal stability, while maintaining full compatibility with all aspects of automated MR media manufacturing technology. Further, the methodology provided by the present invention enjoys diverse utility in the manufacture of all manner of films, devices, and products requiring multilayer magnetic thin film coatings and structures exhibiting very high values of perpendicular anisotropy and magnetic coercivity.

DISCLOSURE OF THE INVENTION

An advantage of the present invention is an improved method for reliably and controllably forming magnetic thin-film, multilayer magnetic superlattice stacks and structure having predetermined high perpendicular magnetic coercivities $H_c$.

Another advantage of the present invention is an improved method for reliably and controllably manufacturing very high recording density perpendicular magnetic recording (MR) media including improved, ultra-thin seed or underlayers and multilayer magnetic superlattice structures having perpendicular magnetic coercivities as high as about 6,000 Oe.

Yet another advantage of the present invention is improved very high recording density, perpendicular magnetic recording media having improved, ultra-thin seed or underlayers and multilayer magnetic superlattice structures having perpendicular magnetic coercivities as high as about 6,000 Oe.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of forming a magnetic thin film having a multilayer magnetic superlattice structure, the multilayer magnetic superlattice structure having a predetermined perpendicular magnetic coercivity $H_c$ and comprising a stacked plurality of magnetic/non-magnetic layer pairs, the method comprising the steps of:

(a) providing a non-magnetic substrate having a surface;

(b) forming an ultra-thin seed layer of predetermined thickness over the substrate surface; and (c) forming the multilayer magnetic superlattice structure on the ultra-thin seed layer by sputtering in an atmosphere having at least a predetermined minimum pressure;

wherein the predetermined perpendicular magnetic coercivity $H_c$ of the multilayer magnetic superlattice structure formed in step (c) is determined by the predetermined thickness of the seed layer formed in step (b).

According to embodiments of the present invention, step (b) comprises forming, e.g., by sputtering over the substrate surface, an ultra-thin seed layer comprising at least one material selected from the group consisting of Pd, Pt, a Pd/Pt bi-layer, a Pt/Pd bi-layer, metals, semi-metals, non-metals, oxides, nitrides, and combinations thereof; and step (c) comprises forming the multilayer magnetic superlattice by alternately sputter depositing the magnetic and non-magnetic layers of the stacked plurality of layer pairs in a sputtering gas atmosphere having at least a minimum pressure of about 30 mTorr.

According to particular embodiments of the invention, step (b) comprises sputter depositing an ultra-thin seed layer of Pd having a predetermined thickness up to about 30 Å; and step (c) comprises forming the stacked plurality of magnetic/non-magnetic layer pairs such that each magnetic layer is from about 2 to about 10 Å thick and comprises a material selected from the group consisting of Co, CoCr, and CoX, where X is B, Ru, Ta, Pt, or Pd, each non-magnetic layer is from about 3 to about 20 Å thick and comprises a material selected from the group consisting of Pt and Pd, and the number n of magnetic/non-magnetic layer pairs is from about 5 to about 50. According to a specific embodiment, step (c) comprises forming a $(Co/Pd)_n$ or a $(Co/Pt)_n$ multilayer magnetic superlattice structure, wherein each Co layer is about 3 Å thick, each Pd or Pt layer is about 10 Å thick, n=20, and the predetermined magnetic coercivity $H_c$ is in the range of from about 3,000 to about 6,000 Oe.

According to a further aspect of the present invention utilizing the above sequence of steps in a method for manufacturing a perpendicular magnetic recording medium including a multilayer magnetic superlattice structure, step (a) comprises providing a non-magnetic substrate comprising a non-magnetic material selected from the group consisting of non-magnetic metals, non-magnetic metal alloys, Al, Al-based alloys, NiP-plated Al, glass, ceramics, polymers, composites, and laminates thereof, the substrate further including a layer of a high magnetic moment material from about 2,000 to about 5,000 Å thick on the substrate surface and comprised of a material selected from the group consisting of FeAlN, NiFe, CoNiFe, and CoZrNb.

According to further embodiments of the present invention, the method comprises the further steps of:

(d) providing a protective overcoat layer on the multilayer magnetic superlattice structure; and (e) providing a lubricant topcoat layer over the protective overcoat layer.

According to particular embodiments of the invention, step (d) comprises depositing a protective overcoat layer having a thickness of from about 20 to about 100 Å thick and comprised of a wear-resistant material selected from the group consisting of diamond-like carbon ("DLC"), a-C:H, a-$CH_xN_y$, a-C:N, ion beam-deposited carbon ("IBD-C"), cathodic arc-deposited carbon ("CAD-C"), $SiN_x$, $AlN_x$, SiC, SiN/C, AlN/C, and SiC/C; and step (e) comprises applying a lubricant topcoat having a thickness of from about 10 to about 35 Å and comprised of a high molecular weight fluoropolyether or perfluoropolyether.

According to another aspect of the present invention, a perpendicular magnetic recording medium comprises, in sequence:

(a) a non-magnetic substrate having a surface;

(b) a layer of a high magnetic moment material on the substrate surface;

(c) an ultra-thin seed layer up to about 30 Å thick on the layer of high magnetic moment material; and (d) a multilayer magnetic superlattice structure on the seed layer, the multilayer magnetic superlattice structure comprising a stacked plurality of magnetic/non-magnetic layer pairs and having a perpendicular magnetic coercivity $H_c$ of from about 3,000 to about 6,000 Oe.

According to embodiments of the present invention, the non-magnetic substrate (a) comprises a non-magnetic material selected from the group consisting of non-magnetic metals, non-magnetic metal alloys, Al, Al-based alloys, NiP-plated Al, glass, ceramics, polymers, composites and laminates thereof; layer (b) of high magnetic moment material is from about 2,000 to about 5,000 Å thick and comprises a material selected from the group consisting of FeAlN, NiFe, CoNiFe, and CoZrNb; ultra-thin seed layer (c) comprises at least one material selected from the group consisting of Pd, Pt, a Pd/Pt bi-layer, a Pt/Pd bi-layer, metals, semi-metals, non-metals, oxides, nitrides, and combinations thereof; and the multilayer magnetic superlattice structure (d) comprises n magnetic/non-magnetic layer pairs, wherein n is an integer from about 5 to about 50, the magnetic layer of each layer pair is from about 2 to about 10 Å thick and comprises a material selected from the group consisting of Co, CoCr, and CoX, where X is B, Ru, Ta, Pt, or Pd, and the non-magnetic layer of each layer pair is from about 3 to about 20 Å thick and comprises a material selected from Pt and Pd.

According to particular embodiments of the present invention, the seed layer (c) comprises sputtered Pd; and the multilayer magnetic superlattice structure comprises sputtered $(Co/Pd)_n$ or $(Co/Pt)_n$, wherein each Co layer is about 3 Å thick, each Pd or Pt layer is about 10 Å thick, and n=20.

According to further embodiments of the present invention, the medium further comprises:

(e) a protective overcoat layer on the multilayer magnetic superlattice structure; and (f) a lubricant topcoat layer on the protective overcoat layer.

According to specific embodiments of the present invention, the protective overcoat layer (e) is from about 20 to about 100 Å thick and comprises a wear-resistant material selected from the group consisting of diamond-like carbon ("DLC"), a-C:H, a-$CH_xN_y$, a-C:N, ion beam-deposited carbon ("IBD-C"), cathodic arc-deposited carbon ("CAD-C"), $SiN_x$, $AlN_x$, SiC, SiN/C, AlN/C, and SiC/C; and the lubricant topcoat layer (f) is from about 10 to about 35 Å thick and comprises a high molecular weight fluoropolyether or perfluoropolyether.

Still another aspect of the present invention is a perpendicular magnetic recording medium comprising:

a multilayer magnetic superlattice structure formed over a surface of a non-magnetic substrate; and ultra-thin seed layer means intermediate the multilayer magnetic superlattice structure and the substrate surface for providing the medium with a predetermined perpendicular magnetic coercivity $H_c$ of from about 3,000 to about 6,000 Oe.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein.

DESCRIPTION OF THE INVENTION

The present invention is based upon the discovery that multilayer magnetic superlattice structures, e.g., $(Co/Pt)_n$ and $(Co/Pd)_n$, having very high perpendicular magnetic coercivities $H_c$ (i.e., $>3 \times 10^3$ Oe), and thus capable of providing perpendicular magnetic recording (MR) media having very high areal recording densities (i.e., bits/in$^2$), can be reliably and controllably fabricated with a predetermined value of $H_c$ by providing a predetermined thickness of an ultra-thin seed layer between the substrate and forming the multilayer magnetic superlattice structure thereover by sputter deposition in a sputtering atmosphere having at least a minimum pressure, i.e., at least about 30 mTorr. The inventive methodology affords several advantages not attainable according to the conventional art, including, inter alia, reliable, controllable, and cost effective formation of very high areal recording density MR media while utilizing conventional sputtering equipment.

Figure 1:
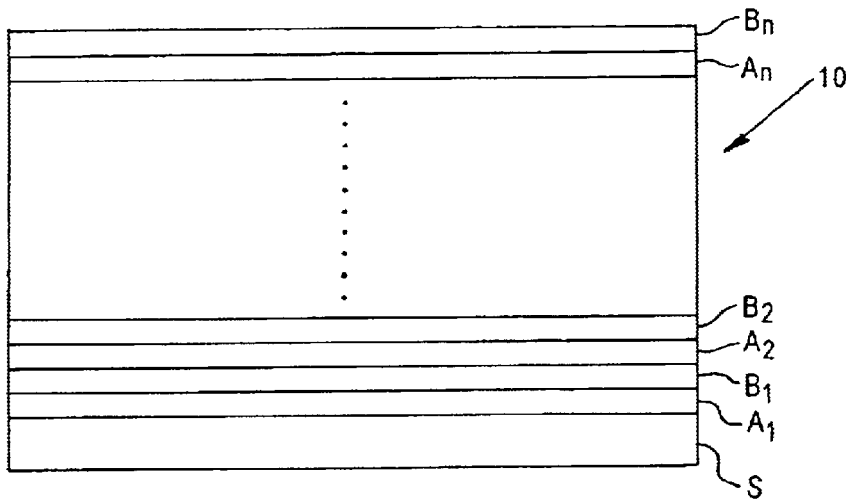
FIG. 1 schematically illustrates, in simplified, schematic cross-sectional view, a $(Co/Pt)_n$ or $(Co/Pd)_n$ multilayer magnetic superlattice structure according to the present invention.
Figure 2:
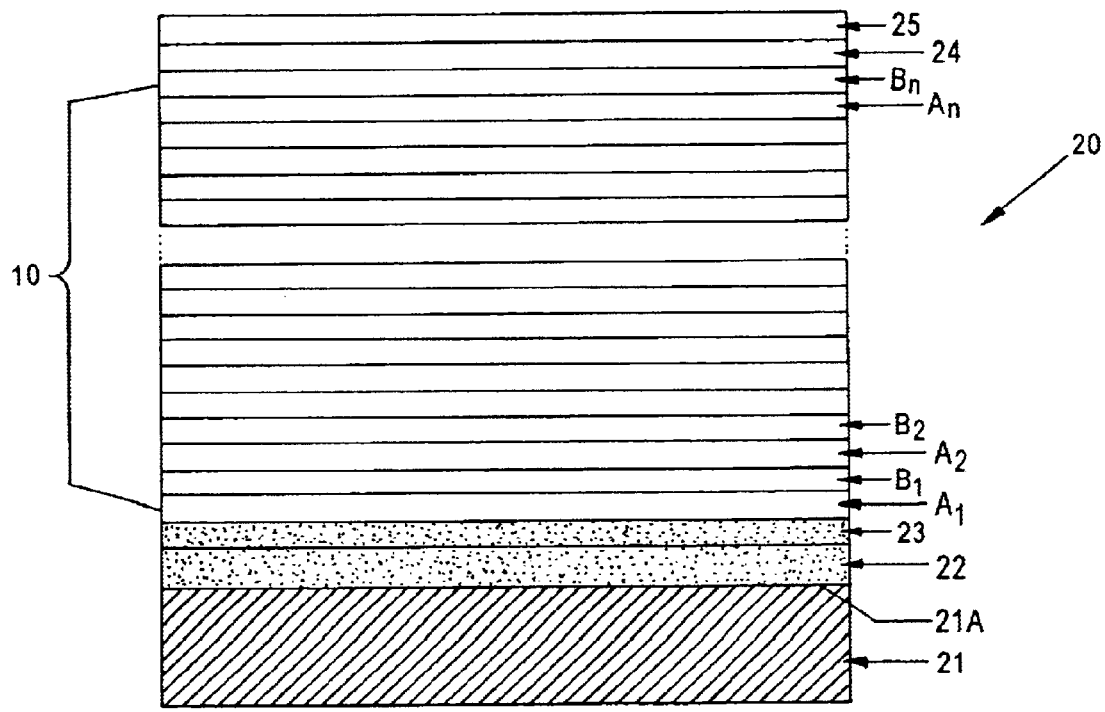
FIG. 2 schematically illustrates, in simplified, schematic cross-sectional view, a perpendicular magnetic recording (MR) medium comprising a multilayer magnetic superlattice structure including an ultra-thin seed or underlayer layer according to the present invention.

Referring now to FIG. 2, shown therein in schematic, cross-sectional view, is an embodiment of a very high areal recording density, perpendicular type MR medium 20 comprising a multilayer magnetic superlattice structure of the type illustrated in FIG. 1 and described supra, which magnetic superlattice structure 10 exhibits a very high and controllable value of perpendicular magnetic coercivity $H_c$ (i.e., $>3 \times 10^3$ Oe). As illustrated, perpendicular MR medium 20 includes a non-magnetic substrate 21 comprised of a non-magnetic material selected from among non-magnetic metals, non-magnetic metal alloys, aluminum (Al), Al-based alloys, NiP-plated Al (NiP/Al), glass, ceramics, polymers, and composites and/or laminates of the aforementioned materials. The thickness of substrate 21 is not critical; however in the case of MR media utilized in hard disk applications, substrate 21 must be of a thickness sufficient to provide a necessary rigidity. Substrate 21 includes a suitable polished or otherwise smoothened upper surface 21A, on which the layer stack constituting the MR medium is formed.

The above-mentioned layer stack comprises, in sequence from the substrate upper surface 21A: (a) a layer 22 of a soft magnetic material from about 2,000 to about 5,000 Å thick, comprising a material selected from among FeAlN, NiFe, CoNiFe, and CoZrNb, with FeAlN being preferred in view of its very high saturation magnetic moment; (b) an ultra-thin seed or underlayer 23 up to about 30 Å thick, of at least one material selected from the group consisting of Pd, Pt, a Pd/Pt bi-layer, a Pt/Pd bi-layer, metals, semi-metals, non-metals, oxides, nitrides, and combinations thereof. In addition to the specifically mentioned metals and metal bi-layers, examples of other materials usable as the ultra-thin seed or underlayer 23 include Ta, $In_2O_3$—$SnO_2$ ("ITO"), Ta/ITO, Si, and $SiN_x$; (c) a multilayer magnetic superlattice structure 10 (similar to that shown in FIG. 1) and comprising a vertically stacked plurality of n magnetic/non-magnetic layer pairs $A_1B_1, A_2B_2 \ldots A_nB_n$, where n is an integer from about 5 to about 50, e.g., about 20, each magnetic layer A is from about 2 to about 10 Å thick, e.g., about 3 Å thick, and comprises a magnetic material selected from among Co, CoCr, and CoX, where X is selected from B, Ru, Ta, Pt, and Pd, and each non-magnetic layer B of each layer pair is from about 3 to about 20 Å thick, e.g., about 10 Å thick, and comprises a non-magnetic material selected from among Pt and Pd; (e) a protective overcoat layer 24 from about 20 to about 100 Å thick, e.g., about 50 Å thick, and comprising a wear-resistant material selected from the group consisting of diamond-like carbon ("DLC"), a-C:H, a-CH$_x$N$_y$, a-C:N, ion beam-deposited carbon ("IBD-C"), cathodic arc-deposited carbon ("CAD-C"), SiN$_x$, AlN$_x$, SiC, SiN/C, AlN/C, and SiC/C; and (f) a lubricant topcoat layer 25 over the protective overcoat layer 24, having a thickness of from about 10 to about 35 Å, e.g., about 23–25 Å thick, and comprised of a high molecular weight fluoropolymer or perfluoropolymer material, e.g., HMW Z-Dol, MMW Z-Dol, Z-Tetraol, AM 2001, and PFPE (available from Ausimont, Thorofare, NJ).

Conventional techniques, such as sputtering, CVD, and/or PVD, may be employed for depositing each of the soft magnetic layer 22, ultra-thin seed or underlayer 23, multilayer magnetic superlattice structure 10, and protective overcoat layer 24, while the lubricant topcoat layer 25 can be deposited by any of a variety of conventional techniques, such as dipping, spraying, etc.

According to the invention, improved multilayer magnetic superlattice structures 10 can be reliably and controllably deposited, as by use of conventional sputtering techniques, so as to exhibit a predetermined (i.e., desired) perpendicular magnetic coercivity $H_c$, by sputter depositing the ultra-thin seed or underlayer of predetermined thickness over layer 22 of soft magnetic material and then sputtering the multilayer magnetic superlattice structure 10 thereon in an atmosphere comprising at least one sputtering gas present at at least a predetermined minimum pressure. According to the invention, each of the sputtering steps is performed in conventional manner, with either DC or RF excitation, at sputtering power densities of from about 15 to about 40 W/in$^2$ of target surface area and target-to-substrate spacings of from about 0.75 to about 2 inches. The substrate temperature is not controlled during sputtering, i.e., additional heat is not supplied and thus the substrate is at ambient temperature.

According to the invention, provided the sputtering gas is present during formation of the multilayer magnetic superlattice structure 10 at at least the predetermined minimum pressure, the perpendicular anisotropy $H_c$ of the multilayer magnetic superlattice structure 10 formed on the ultra-thin seed or underlayer 23 is reliably and controllably varied in substantially direct proportion to the seed or underlayer thickness, e.g., from about 3,000 Oe at very low seed layer thicknesses (i.e., <1 Å) to about 6,000 Oe at greater seed layer thicknesses (i.e., ~30 Å). As a consequence of the dependence of $H_c$ of the magnetic superlattice upon the thickness of the ultra-thin seed or underlayer, according to the invention, control of the seed or underlayer thickness may be advantageously utilized for reliably obtaining multilayer magnetic superlattice structures having a predetermined, i.e., desired, value of the perpendicular magnetic coercivity $H_c$.

Figure 3:
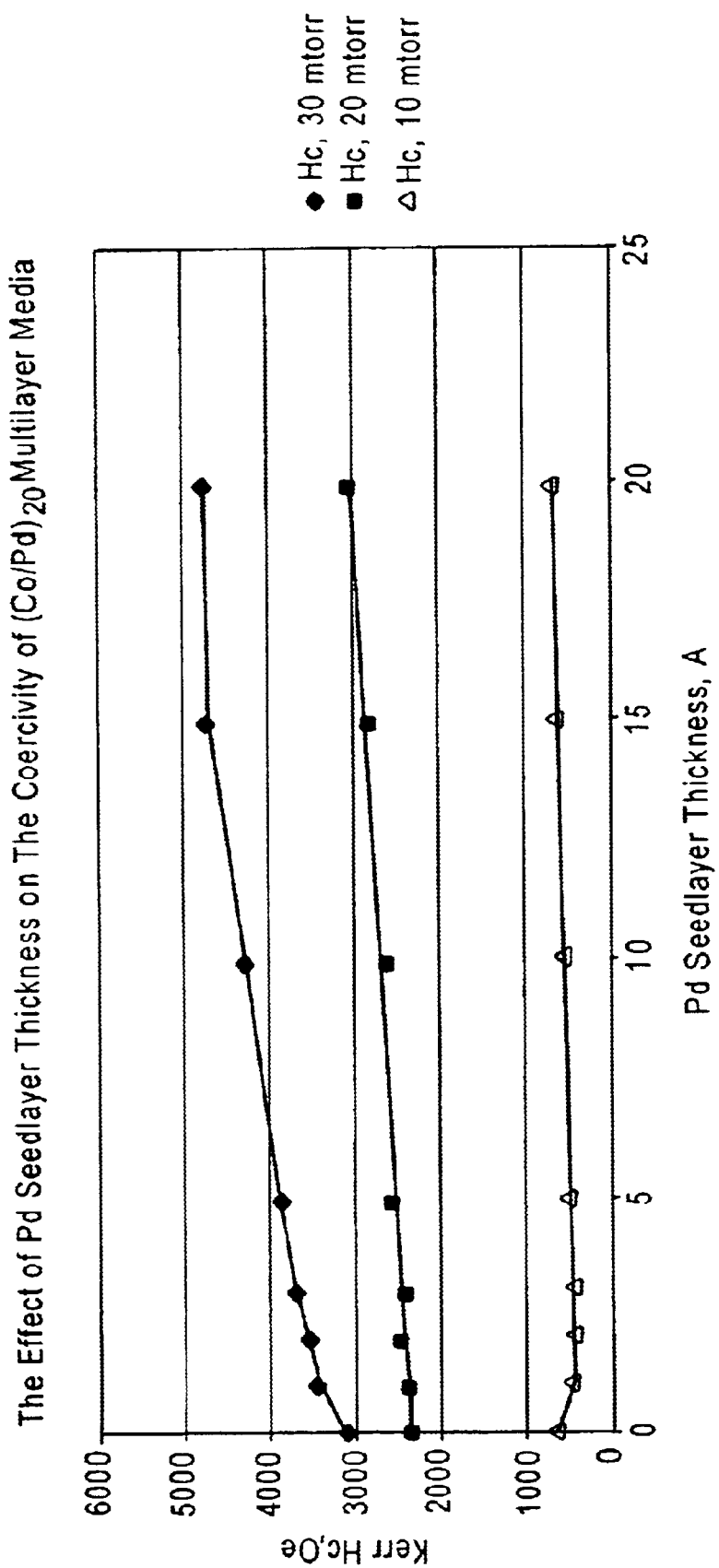
FIG. 3 is a graph illustrating the effects of variation of seed or underlayer thickness and sputtering gas pressure on the perpendicular coercivity of $(Co/Pd)_n$ multi layer magnetic superlattice structures.

Adverting to FIG. 3, which is a graph showing the variation of Pd seed or underlayer thickness and (Co/Pd)$_n$ superlattice sputtering gas (Ar) pressure on the perpendicular magnetic coercivity $H_c$ of (Co/Pd)$_{20}$ multilayer magnetic superlattice structures, it is evident therefrom that at a minimum (Co/Pd)$_n$ sputtering gas pressure of about 30 mTorr, the $H_c$ value thereof varies directly with the thickness of the ultra-thin Pd seed or underlayer in the range of from about <1 to about 20 Å. As is also evident from the figure, the variation of $H_c$ with seed layer thickness at lower (Co/Pd)$_n$ sputtering gas pressures is insufficient for providing adequate variation, and thus regulation/control of $H_c$. Thus, for example, in the case of (Co/Pd)$_n$ sputtering gas pressure of at least about 30 mTorr, for a desired coercivity $H_c$ range of from about 4,000 to about 5,000 Oe, the required seed layer thickness is generally less than about 20 Å; whereas, for a desired coercivity $H_c$ range of from about 3,000 to about 4,000 Oe, the required seed layer thickness is generally less than about 5 Å. Seed layer thicknesses greater than about 20 Å, e.g., about 30 Å, can yield coercivities in the range of from about 5,000 to about 6,000 Oe.

While the exact mechanism or reason for the dependence of the perpendicular magnetic coercivity $H_c$ of the multilayer magnetic superlattice structures on the underlying seed layer is not known with certainty, and not wishing to be bound by any particular theory, it is nonetheless believed that the advantageous result provided by the present invention arises from enhanced domain wall pinning of the superlattice structure attributed to the optimized thickness seed layer, which domain wall pinning enhances the perpendicular interfacial anisotropy $K_u$, and thus the perpendicular coercivity of the superlattice.

Thus, the present invention advantageously provides, as by use of conventional sputtering equipment and techniques, improved, high quality, thermally stable, multilayer magnetic superlattice structures having readily controllable, very high values of perpendicular magnetic coercivity $H_c$. As a consequence, the inventive methodology facilitates reliable, cost-efficient fabrication of very high areal density, perpendicular MR media utilizing such improved multilayer magnetic superlattice structures as the active recording layer. Moreover, the inventive methodology can be practiced in a cost-effective manner utilizing conventional manufacturing technology and equipment for automated, large-scale manufacture of MR media, such as hard disks. Finally, the invention is not limited to use with hard disk substrates but rather is broadly applicable to the formation of high magnetic coercivity multilayer magnetic superlattice structures for use in all manner of devices and products.

In the previous description, numerous specific details are set forth, such as specific materials, structures, processes, etc., in order to provide a better understanding of the present invention. However, the present invention can be practiced without resorting to the details specifically set forth herein. In other instances, well-known processing techniques and structures have not been described in order not to unnecessarily obscure the present invention.

Only the preferred embodiments of the present invention and but a few examples of its versatility are shown and described in the present disclosure. It is to be understood that the present invention is capable of use in various other combination and environments and is susceptible of changes and/or modifications whithin the scope of the inventive concept as expressed herein.

What is claimed is:

1. A method of forming a magnetic thin film having a multilayer magnetic superlattice structure, said multilayer magnetic superlattice structure having a perpendicular magnetic coercivity $H_c$ of from about 3,000 to about 5,000 Oe and comprising a stacked plurality of magnetic/non-magnetic layer pairs, said method comprising the steps of:

(a) providing a non-magnetic substrate having a surface;

(b) forming a layer of soft magnetic material on said substrate surface;

(c) forming an ultra-thin seed layer up to about 20 Å thick on said layer of soft magnetic material; and (d) forming said multilayer magnetic superlattice structure on said ultra-thin seed layer by sputtering in an atmosphere having at least a predetermined minimum pressure.

2. The method according to claim 1, wherein:
step (c) comprises forming an ultra-thin seed layer comprising at least one material selected from the group consisting of Pd, Pt, a Pd/Pt bi-layer, a Pt/Pd bi-layer, metals, semi-metals, non-metals, oxides, nitrides, and combinations thereof.

3. The method according to claim 2, wherein:
step (c) comprises sputter depositing said ultra-thin seed layer over said substrate surface.

4. The method according to claim 1, wherein:
step (d) comprises forming said multilayer magnetic superlattice by alternately sputter depositing said magnetic and non-magnetic layers of said stacked plurality of layer pairs in a sputtering gas atmosphere having at least a minimum pressure of about 30 mTorr.

5. The method according to claim 4, wherein:
step (d) comprises forming said stacked plurality of magnetic/non-magnetic layer pairs such that each magnetic layer is from about 2 to about 10 Å thick and comprises a material selected from the group consisting of Co, CoCr, and CoX, where X is B, Ru, Ta, Pt, or Pd; each non-magnetic layer is from about 3 to about 20 Å thick and comprises a material selected from the group consisting of Pt and Pd; and the number n of magnetic/non-magnetic layer pairs is from about 5 to about 50.

6. The method according to claim 5, wherein:
step (c) comprises sputter depositing a seed layer of Pd having a predetermined thickness of up to about 20 Å; and
step (d) comprises forming a $(Co/Pd)_n$ or $(Co/Pt)_n$ multilayer magnetic superlattice structure, wherein each Co layer is about 3 Å thick, each Pd or Pt layer is about 10 Å thick, and n=20.

7. A method of manufacturing a perpendicular magnetic recording medium including a multilayer magnetic superlattice structure fabricated according to claim 1, wherein:
step (a) comprises providing a non-magnetic substrate comprising a non-magnetic material selected from the group consisting of non-magnetic metals, non-magnetic metal alloys, Al, Al-based alloys, NiP-plated Al, glass, ceramics, polymers, composites, and laminates thereof; and said soft magnetic material is from about 2,000 to about 5,000 Å thick on said substrate surface and comprised of a material selected from the group consisting of FeAlN, NiFe, CoNiFe, and CoZrNb.

8. The method according to claim 7, comprising the further steps of:
(e) providing a protective overcoat layer on said multilayer magnetic superlattice structure; and
(f) providing a lubricant topcoat layer over said protective overcoat layer.

9. The method according to claim 8, wherein:
step (e) comprises depositing a protective overcoat layer having a thickness of from about 20 to about 100 Å thick and comprised of a wear-resistant material selected from the group consisting of diamond-like carbon ("DLC"), a-C:H, a-$CH_xN_y$, a-C:N, ion beam-deposited carbon ("IBD-C"), cathodic arc-deposited carbon ("CAD-C"), $SiN_x$, $AlN_x$, SiC, SiN/C, AlN/C, and SiC/C; and
step (f) comprises applying a lubricant topcoat having a thickness of from about 10 to about 35 Å and comprised of a high molecular weight fluoropolyether or perfluoropolyether.

10. A perpendicular magnetic recording medium, comprising in sequence:
(a) a non-magnetic substrate having a surface;
(b) a layer of a soft magnetic material on said substrate surface;
(c) an ultra-thin seed layer up to about 20 Å thick on said layer of soft magnetic material; and
(d) a multilayer magnetic superlattice structure on said seed layer, said multilayer magnetic superlattice structure comprising a stacked plurality of magnetic/non-magnetic layer pairs and having a perpendicular magnetic coercivity $H_c$ of from about 3,000 to about 5,000 Oe.

11. The medium according to claim 10, wherein:
said ultra-thin seed layer (c) comprises at least one material selected from the group consisting of Pd, Pt, a Pd/Pt bi-layer, a Pt/Pd bi-layer, metals, semi-metals, non-metals, oxides, nitrides, and combinations thereof.

12. The medium according to claim 11, wherein:
said multilayer magnetic superlattice structure (d) comprises n magnetic/non-magnetic layer pairs, wherein n is an integer from about 5 to about 50, the magnetic layer of each layer pair is from about 2 to about 10 Å thick and comprises a material selected from the group consisting of Co, CoCr, and CoX, where x is B, Ru, Ta, Pt, or Pd, and the non-magnetic layer of each layer pair is from about 3 to about 20 Å thick and comprises a material selected from the group consisting of Pt and Pd.

13. The medium according to claim 12, wherein:
said ultra-thin seed layer (c) comprises sputtered Pd; and
said multilayer magnetic superlattice structure (d) comprises sputtered $(Co/Pd)_n$ or $(Co/Pt)_n$, wherein each Co layer is about 3 Å thick, each Pd or Pt layer is about 10 Å thick, and n=20.

14. The medium according to claim 10, wherein:
said non-magnetic substrate (a) comprises a non-magnetic material selected from the group consisting of non-magnetic metals, non-magnetic metal alloys, Al, Al-based alloys, NiP-plated Al, glass, ceramics, polymers, composites, and laminates thereof; and
said layer (b) of soft magnetic material is from about 2,000 to about 5,000 Å thick and comprises a material selected from the group consisting of FeAlN, NiFe, CoNiFe, and CoZrNb.

15. The medium according to claim 10, further comprising:
(e) a protective overcoat layer on said multilayer magnetic superlattice structure; and
(f) a lubricant topcoat layer on said protective overcoat layer.

16. The medium according to claim 15, wherein:
said protective overcoat layer (e) is from about 20 to about 100 Å thick and comprises a wear-resistant material selected from the group consisting of diamond-like carbon ("DLC"), a-C:H, a-$CH_xN_y$, a-C:N, ion beam-deposited carbon ("IBD-C"), cathodic arc-deposited carbon ("CAD-C"), $SiN_x$, $AlN_x$, SiC, SiN/C, AlN/C, and SiC/C; and
said lubricant topcoat layer (f) is from about 10 to about 35 Å thick and comprises a high molecular weight fluoropolyether or perfluoropolyether.

17. A perpendicular magnetic recording medium, comprising:
a multilayer magnetic superlattice structure formed over a surface of a non-magnetic substrate; and ultra-thin seed layer means intermediate said multilayer magnetic superlattice structure and said substrate surface for providing said medium with a predetermined perpendicular magnetic coercivity $H_c$ of from about 3,000 to about 5,000 Oe, wherein said ultra-thin seed layer means is up to about 20 Å thick.

18. The medium according to claim 17, wherein:

said ultra-thin seed layer means is comprised of at least one material selected from the group consisting of Pd, Pt, a Pd/Pt bi-layer, a Pt/Pd bi-layer, metals, semi-metals, oxides, nitrides, and combinations thereof; and said multi layer magnetic superlattice structure comprises n magnetic/non-magnetic layer pairs, where n is an integer from about 5 to about 50, the magnetic layer of each layer pair is from about 2 to about 10 Å thick and comprises a material selected from the group consisting of Co, CoCr, and CoX, where X is B, Ru, Ta, Pt, or Pd, and the non-magnetic layer of each layer pair is from about 3 to about 20 Å thick and comprises a material selected from the group consisting of Pt and Pd.

19. The medium according to claim 18, wherein:

said ultra-thin seed layer means comprises sputter-deposited Pd or Pt; and said multilayer magnetic superlattice structure comprises sputtered $(Co/Pd)_n$ or $(Co/Pt)_n$, wherein each Co layer is about 3 Å thick and each Pd or Pt layer is about 10 Å thick, and n=20.

20. The medium according to claim 17, further comprising:

a protective overcoat layer on said multilayer magnetic superlattice structure; and a lubricant topcoat layer on said protective overcoat layer.

\* \* \* \* \*